(12) United States Patent
Furuya

(10) Patent No.: US 7,126,392 B2
(45) Date of Patent: Oct. 24, 2006

(54) SEMICONDUCTOR INTEGRATED DEVICE HAVING REDUCED JITTER AND REDUCED CURRENT CONSUMPTION

(75) Inventor: Yasunari Furuya, Fujimi machi (JP)

(73) Assignee: Seiko Epson Corporation (JP)

( * ) Notice: Subject to any disclaimer, the term of this patent is extended or adjusted under 35 U.S.C. 154(b) by 18 days.

(21) Appl. No.: 10/999,365

(22) Filed: Nov. 29, 2004

(65) Prior Publication Data

US 2005/0127962 A1 Jun. 16, 2005

(30) Foreign Application Priority Data

Nov. 28, 2003 (JP) ............................ 2003-400027

(51) Int. Cl.
*H03L 7/06* (2006.01)
(52) U.S. Cl. ...................................... 327/147; 327/156
(58) Field of Classification Search ........ 327/147–148, 327/156–157, 162, 163; 331/1 A, 17, 25, 331/DIG. 2; 375/373, 375, 376
See application file for complete search history.

(56) References Cited

U.S. PATENT DOCUMENTS 6,246,294 B1 *  6/2001  Gai .............................. 331/57
6,704,892 B1 *  3/2004  Kurd et al. ................ 714/724

OTHER PUBLICATIONS

Berlin, Howard M., "Design of Phase-Locked Loop Circuits, with Experiments (PLL no sekkei to jitsuyou kairo)", 3 sheets and 1 sheet of partial translation.

* cited by examiner

*Primary Examiner*—Linh My Nguyen
(74) *Attorney, Agent, or Firm*—Harness, Dickey & Pierce, P.L.C.

(57) ABSTRACT

A structure is provided for significantly reducing the current excessively consumed for generating a high-speed clock signal necessary for signal processing, and significantly improve the jitter characteristics of the high-speed clock signal. The structure includes a reference-clock signal generation circuit, a time-base processing circuit, a PLL circuit, and a high-speed signal processing circuit. A low-speed reference-clock signal generated by the reference-clock signal generation circuit is provided to the PLL circuit. The PLL circuit generates a high-speed clock signal by multiplying the reference-clock signal by a factor of N. The factor N is at least 100. To reduce a jitter of the high-speed clock signal generated by the PLL circuit, a natural angular frequency $\omega n$ and a damping factor $\zeta$ that relate to the response characteristics of the system of the PLL circuit are set to range from 3 kHz to 10 kHz, and 0.01 or less, respectively.

12 Claims, 3 Drawing Sheets

SEMICONDUCTOR INTEGRATED DEVICE HAVING REDUCED JITTER AND REDUCED CURRENT CONSUMPTION

RELATED APPLICATIONS

This application claims priority to Japanese Patent Application No. 2003-400027 filed Nov. 28, 2003 which is hereby expressly incorporated by reference herein in its entirety.

BACKGROUND

1. Field of the Invention

The present invention relates to a semiconductor integrated device equipped with a reference-clock signal generation circuit that generates a low-speed reference-clock signal, and a high-speed signal processing circuit that can conduct high-speed signal processing.

2. Related Art

A conventional semiconductor integrated device is equipped with, as shown in FIG. 6, a reference-clock signal generation circuit 1, a time-base processing circuit 2, a fundamental-frequency-oscillation circuit 3, a phase-locked loop (PLL) circuit 4, and a high-speed signal processing circuit 5.

In a semiconductor integrated device composed as illustrated, the reference-clock signal generation circuit 1 is constituted of a quartz-oscillation circuit etc., generating a low-speed reference-clock signal S1. The frequency of reference-clock signal S1 is, for example, 32 kHz.

The time-base processing circuit 2 conducts a variety of processes, such as dividing the reference-clock signal S1 fed from the reference-clock signal generation circuit 1 to generate (and output) time data (time information), handling interruptions into the high-speed signal processing circuit 5 based on the time data, and monitoring with a watchdog timer function.

The fundamental-frequency-oscillation circuit 3 is constituted of a quartz-oscillation circuit etc., and generates a medium-speed clock signal S2. The PLL circuit 4 generates a high-speed clock signal S3 by multiplying the clock signal S2 fed from the fundamental-frequency-oscillation circuit 3 by a factor of N. Here, the frequency of the clock signal S2 is, for example, several MHz. The factor N for the clock signal S2 is up to around several dozen.

The high-speed signal processing circuit 5 is driven by the clock signal S3, conducts predetermined data processing of a high-speed signal S4 that is input from the outside, and outputs a processed high-speed signal S5 to the outside.

The PLL circuit 4 shown in FIG. 6 is composed, in general, of a phase comparator, a loop filter, a voltage-controlled oscillator (VCO), and a frequency divider (for example, refer to Howard M. Berlin. *Design of Phase-Locked Loop Circuits, with Experiments (PLL no sekkei to jitsuyou kairo.* (Japanese translation)). Translated by Keiichi Miyata, et al. C-Task).

The characteristics of a PLL circuit composed as illustrated can be determined by analyzing the transfer characteristic of its feedback loop. Here, a natural angular frequency $\omega n$ and a damping factor $\zeta$ are considered to be important elements for specifying the response of the system of the PLL circuit.

If the frequency of the clock signal S3 is in the range between several MHz to several hundred MHz as in the conventional PLL circuit shown in FIG. 6, it is suggested that, in order to maximize the performance of that PLL circuit, the natural angular frequency $\omega n$ can be several MHz and the damping factor $\zeta$ be within the range of 0.5 to 0.8 inclusive.

Moreover, in order for both the natural angular frequency $\omega n$ and the damping factor $\zeta$ to fall within the aforementioned ranges, the capacity of a capacitor used for the loop filter composing the PLL circuit is required to be large, and consequently, an external capacitor has been used conventionally.

However, the conventional semiconductor integrated device shown in FIG. 6 is equipped with the reference-clock signal generation circuit 1 and the fundamental-frequency-oscillation circuit 3, and there is a large difference in the frequencies of the signals generated by each of the circuits. For this reason, the fundamental-frequency-oscillation circuit 3 that has a higher oscillating frequency consumes more current than the reference-clock signal generation circuit 1 that has a lower oscillating-frequency. For example, provided that the oscillating frequency of the reference-clock signal S1 generated by the reference-clock signal generation circuit 1 is 32 KHz, and that the oscillating frequency of the clock signal S2 oscillated by the fundamental-frequency-oscillation circuit 3 is several MHz, the current consumed by the fundamental-frequency-oscillation circuit 3 becomes at least 100 times larger than that of the reference-clock signal generation circuit 1.

Moreover, in conventional semiconductor integrated devices, a capacitor used for a loop filter composing a PLL circuit is provided externally as described above, thus impairing the characteristics of the PLL loop.

In view of the above-mentioned problems, the present invention aims to provide a semiconductor integrated device that is able to significantly reduce the amount of current excessively consumed upon generating high-speed clock signals that are necessary for signal processing.

Furthermore, the present invention aims to provide a semiconductor integrated device that is able to significantly improve the jitter characteristics of high-speed clock signals that are necessary for signal processing when generating these high-speed clock signals, and to prevent malfunctions upon conducting signal processing with these clock signals.

Further, the present invention aims to provide a semiconductor integrated device which eliminates the need for an external capacitor, thereby cutting costs by reducing the number of unit items, and preventing its characteristics from worsening because of the use of such an external capacitor.

SUMMARY

In order to solve the afore mentioned problems, aspects of the present invention include the following.

A first aspect of the present invention provides a semiconductor integrated device including a reference-clock signal generation circuit that generates a predetermined low-speed reference-clock signal used for time base; a high-speed signal processing circuit that conducts high-speed signal processing; and a phase-locked loop (PLL) circuit that generates a high-speed clock signal by multiplying a frequency of the reference-clock signal generated by the reference-clock signal generation circuit by a factor of N, and provides the high-speed signal processing circuit with the generated high-speed clock signal as a driving signal of the high-speed signal processing circuit. The range of the reference-clock signal generated by the reference-clock signal generation circuit is from 10 KHz to 100 KHz inclusive, and the factor N is at least 100.

A second aspect of the present invention provides a semiconductor integrated device including a high-speed signal processing circuit that conducts high-speed signal processing; and a PLL circuit that inputs a predetermined low-speed reference-clock signal used for time base from an outside source, generates a high-speed clock signal by multiplying a frequency of the input reference-clock signal by a factor of N, and provides the high-speed signal processing circuit with the generated high-speed clock signal as a driving signal of the high-speed signal processing circuit. The range of the reference-clock signal input from the outside source is from 10 KHz to 100 KHz inclusive, and the factor N is at least 100.

In a third aspect of the present invention, in addition to the first or the second aspect of this invention, the PLL circuit includes: an oscillator that generates an oscillation frequency in accordance with a voltage-controlled voltage that is input; a divider-circuit that divides the oscillation frequency of the oscillator by N; a phase comparator that makes a phase comparison between a reference-clock signal generated by the reference-clock signal generation circuit and an output signal of the divider-circuit; a charge pump circuit that generates a signal in response to the phase comparison of the phase comparator; and a loop filter that makes only a low frequency component out of an output signal of the charge pump circuit pass through as an output signal, and provides the oscillator with the output signal as the voltage-controlled voltage. Each element of the PLL circuit is made into an integrated circuit. The value of N for dividing the frequency by the divider-circuit is at least 100.

In a forth aspect of the present invention, in addition to the first, second, or third aspect of this invention, the range of a natural angular frequency ωn that relates to a response of a system of the PLL circuit is from 3 kHz to 10 kHz inclusive, and a damping factor ζ that relates to the response is 0.01 or less.

In a fifth aspect of the present invention, in addition to the forth aspect of this invention, the loop filter includes a low-pass filter having a capacitor and a resistor in combination. The range of a capacity of the capacitor is from 300 pF to 1000 pF inclusive, and the range of a resistance of the resistor is from 0.1 kΩ to 10 kΩ inclusive.

In a sixth aspect of the present invention, in addition to the fifth aspect of this invention, the range of an electric current value of the charge pump circuit is from 0.5 µA to 3 µA inclusive.

In a seventh aspect of the present invention, in addition to the fifth or the sixth aspect of this invention, the capacitor of the loop filter is created with a gate capacitance of a MOS transistor.

With the present invention composed as such, it is possible to significantly reduce the amount of current that is excessively consumed for generating high-speed clock signals that are necessary for signal processing.

Furthermore, with the present invention, it is possible to significantly improve the jitter characteristics of the high-speed clock signals that are necessary for signal processing upon generating these high-speed clock signals, and to prevent malfunctions upon conducting signal processing with these clock signals.

Further, with the present invention, it is possible to eliminate the need for an external capacitor, thereby cutting costs by reducing the number of unit items, and preventing its characteristics from worsening because of the use of such an external capacitor.

DETAILED DESCRIPTION

An embodiment of this invention will now be described with references to the accompanying drawings.

Prior to the description of the embodiment of the present invention, the basic principles of this invention are described.

The present invention uses a low-speed base-clock signal for time base to generate high-speed clock signals that are necessary for signal processing, and prevents excessive current consumption. For this reason, as FIG. 1 shows, a base-clock signal S1 generated by a base-clock signal generation circuit 11 is provided to a time-base processing circuit 12 and to a PLL circuit 14 individually.

The present invention also makes it possible to generate a high-speed clock signal S3, while setting the range of the base-clock signal S1, generated by the base-clock signal generation circuit 11, low, for example, from 10 kHz to 100 kHz, and setting a factor N by which the PLL circuit 14 multiplies the base-clock signal S1 high, such as at least 100.

Figure 1:
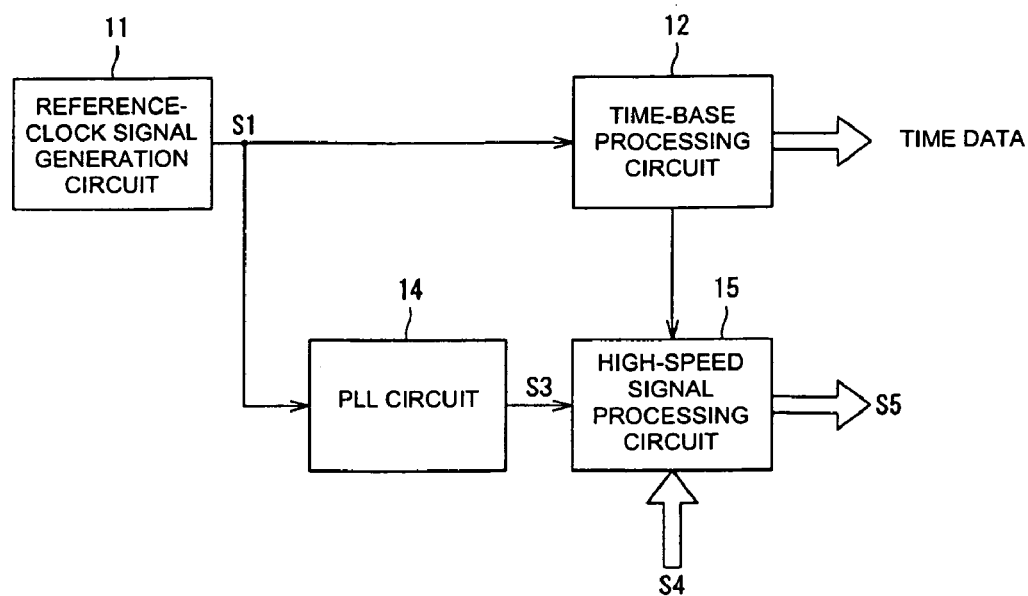
FIG. 1 is a block diagram illustrating the composition of an embodiment of the present invention.
Figure 6:
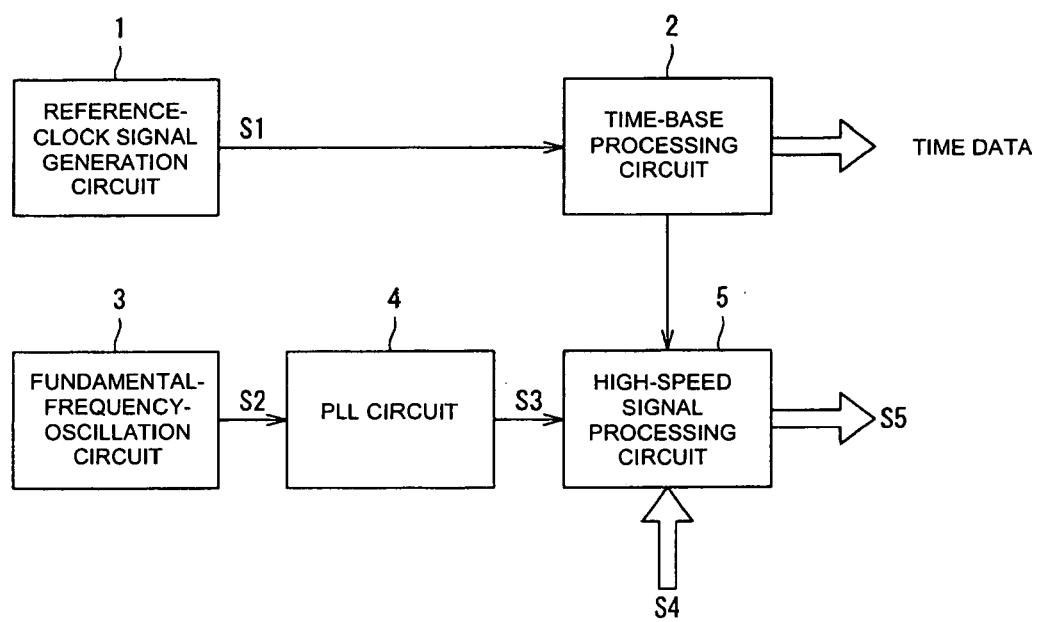
FIG. 6 is a block diagram showing one example of a conventional device.

However, in the PLL circuit 14 as shown in FIG. 1 that utilizes the clock signal S1 of the reference-clock signal generation circuit 11, if a natural angular frequency ωn that relates to the response characteristics of its system, and a damping factor ζ are set in the same way as the PLL circuit 4 shown in FIG. 6, it was discovered that a jitter (time-base fluctuation) for the clock signal S3 worsens in the case where the frequency of the generated high-speed clock signal S3 is set high.

Figure 4:
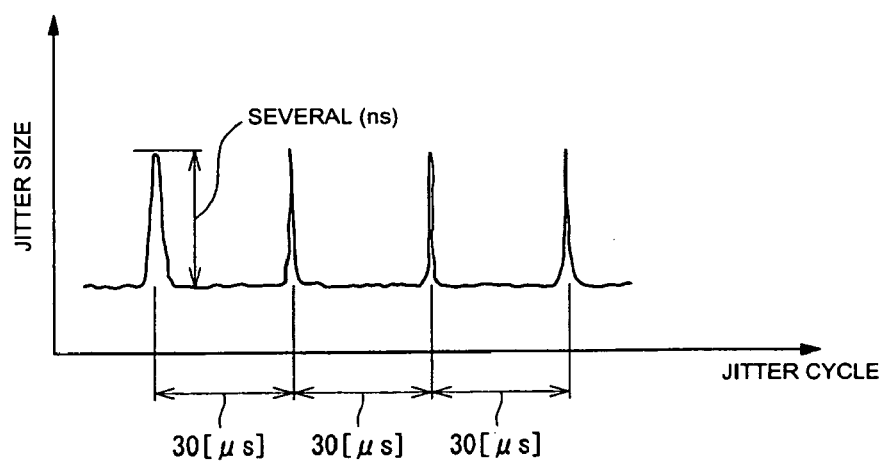
FIG. 4 is a characteristics diagram showing the jitter characteristics that become problematic upon implementing the present invention.

More specifically, by setting the frequency of the base-clock signal S1 of the base-clock signal generation circuit 11 at 32 kHz, and setting the frequency of the high-speed clock signal S3 generated by the PLL circuit 14 at 100 MHz, and if operated with the natural angular frequency ωn set to several MHz and the damping factor ζ within the range of 0.5 to 0.8, jitter characteristics are as shown in FIG. 4. FIG. 4 shows that a jitter of several ns is generated in a 30-µs cycle, attributed to the base-clock signal S1 with a frequency of 32 kHz.

For example, assuming that the base-clock signal S1 frequency is 32 kHz, the multiplying factor N of the PLL circuit 14 is about 15,000, and the clock signal S3 frequency is 500 MHz, the clock signal S3 will have a jitter of several ns generated every 30 µs, and thus, there will be a jitter of several ns for 1 ns of a half-cycle time of the clock signal S3. This may lead a high-speed signal processing circuit 15 operating with the clock signal S3 as a driving signal to occur malfunctions because of the jitter, in the case where the multiplying factor N of the PLL circuit 14 is set high with the base-clock signal S1 being low speed.

Consequently, as a result of keen research, the present inventors found the values of the natural angular frequency ωn and the damping factor ζ that relate to the response characteristics of the PLL circuit 14 in order to significantly reduce the jitter. Based on both of the preferred values, the value of the capacitor capacity of the loop filter that composes the PLL circuit 14 is set as described later.

Hereafter, a semiconductor-integrated device according to the embodiment of the present invention that is materialized based on the above principles is described with references to the drawings.

The embodiment of the present invention provides a structure including, as shown in FIG. 1, the reference-clock signal generation circuit 11, the time-base processing circuit 12, the PLL circuit 14, and the high-speed signal processing circuit 15. The reference-clock signal S1 generated by the reference-clock signal generation circuit 11 is provided to the PLL circuit 14. The PLL circuit 14 generates the high-speed clock signal S3 by multiplying the reference-clock signal S1 by a factor of N. Here, the multiplying factor N of the PLL circuit 14 is at least 100, with no specific upper limit.

In addition, in the embodiment composed of the above, the elements thereof are made into an integrated circuit on a semiconductor substrate.

Moreover, in order to reduce a jitter of the high-speed clock signal S3 that is generated from the PLL circuit 14, the embodiment of the present invention sets the following preferred ranges for both a natural angular frequency ωn and a damping factor ζ that relate to the response characteristics of the system of the PLL circuit 14. That is to say, the preferred values of the natural angular frequency ωn and the damping factor ζ are in the range of 3 KHz to 10 KHz, and 0.01 or less, respectively.

Furthermore, the present embodiment of this invention sets the values of both the capacity of a capacitor 232 and the resistance of a resistor 231 of a loop filter 23 (refer to FIG. 3) that compose the PLL circuit 14 as described below, based on the natural angular frequency ωn and the damping factor ζ of the PLL circuit 14.

The composition of each unit in the present embodiment will now be described, while referring to FIGS. 1, 2 and 3.

In FIG. 1, the base-clock signal generation circuit 11 corresponds to the base-clock signal generation circuit 1 in FIG. 6, and is constituted of a quartz-oscillation circuit etc, generating the low-speed reference-clock signal S1. The range of frequency for the reference-clock signal S1 that is generated in the reference-clock signal generation circuit 11 is from 10 kHz to 100 kHz, and in this example, the frequency is set to 32 kHz.

The time-base processing circuit 12 conducts a variety of processes, such as dividing the reference-clock signal S1, thus generating and outputting time data fed from the reference-clock signal generation circuit 11, handling interruptions into the high-speed signal processing circuit 15 based on the time data, and monitoring with a watchdog timer function. This time-base processing circuit 12 corresponds to the time-base processing circuit 2 shown in FIG. 6.

The PLL circuit 14 multiplies the low-speed clock signal S1 from the base-clock signal generation circuit 11 by a factor of N, and generates the high-speed clock signal S3. The factor N needs to be at least 100, as described above, with no specific upper limit specified, yet it is preferable that the number be, for example, in the range of 100 to 20,000. Moreover, the range of the frequency of the clock signal S3, that is generated in the PLL circuit 14, is from several tens of MHz to several hundred 100 MHz. For example, the frequency is set to the range of 10 MHz to 700 MHz.

The high-speed signal processing circuit 15 is driven by the clock signal S3, generated by the PLL circuit 14, the clock signal S3 being a driving signal. The high-speed signal processing circuit 15 conducts a prescribed data processing on a high-speed signal S4 that is incoming from the outside, and outputs a processed high-speed signal S5 to the outside. This high-speed signal processing circuit 15 corresponds to the high-speed signal processing circuit 5 shown in FIG. 6.

Figure 2:
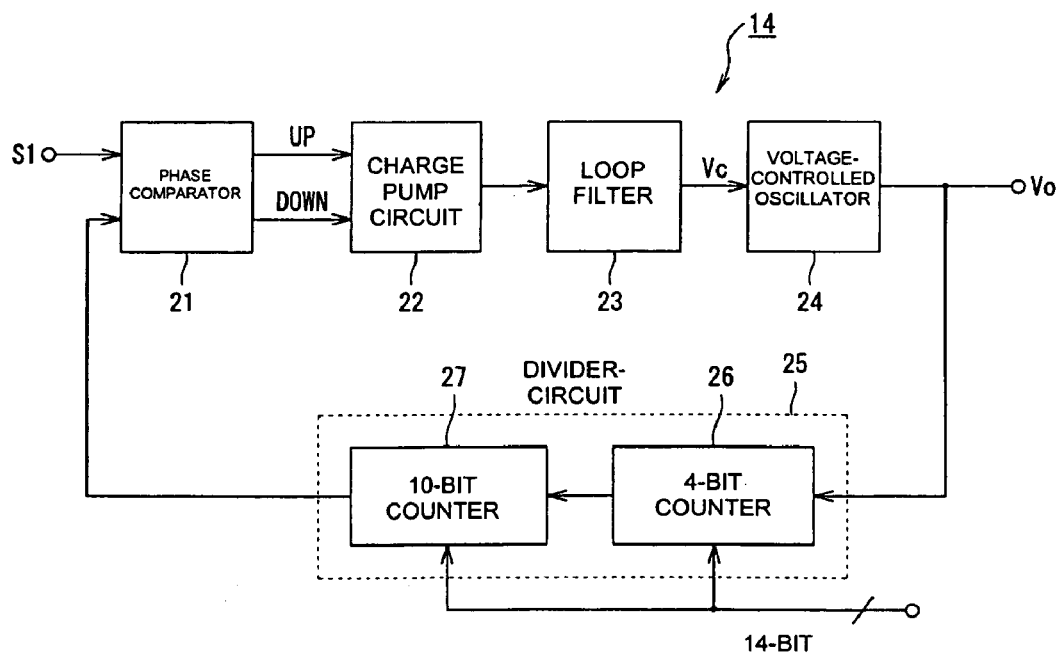
FIG. 2 is a block diagram showing the specific composition of the PLL circuit shown in FIG. 1.

Hereafter, the specific composition of the PLL circuit 14, shown in FIG. 1, is described while referring to FIG. 2.

This PLL circuit 14 is, as shown in FIG. 2, equipped with a phase comparator 21, a charge pump circuit 22, the loop filter 23, a voltage-controlled oscillator (VCO) 24, and a divider-circuit 25, which form a PLL loop as shown in the figure.

Here, the composing elements of the PLL circuit 14 are made into an integrated circuit.

The phase comparator 21 conducts a phase comparison between the low-speed clock signal S1 from the base-clock signal generation circuit 11 and the output signal from the divider-circuit 25, and outputs the output signal, that corresponds to the comparison result, to the charge pump circuit 22. More specifically, the phase comparator 21 outputs, for example, as a result of phase comparison, an 'UP' signal if the output signal of the divider-circuit 25 is phase-lagging relative to the clock signal S1, or a 'DOWN' signal if the output thereof is phase-leading.

The charge pump circuit 22 generates a signal that corresponds with an 'UP' signal or a 'DOWN' signal sent from the phase comparator 21, and outputs the generated signal to the loop filter 23.

The loop filter 23 filters out output signals by passing only the low frequency component out of the output signal of the charge pump circuit 22, and provides the filtered-out output signals to the voltage-controlled oscillator 24. That is to say, the loop filter 23 smoothes out the output signals of the charge pump circuit 22, and provides the smoothed out output signal to the voltage-controlled oscillator 24.

The voltage-controlled oscillator 24, while oscillating in a prescribed frequency, controls the oscillating-frequency according to control-voltage Vc provided from the loop filter 23. The oscillated output of this voltage-controlled oscillator 24 is filtered out as output signal Vo of the PLL circuit 14, while being provided to the divider-circuit 25.

The divider-circuit 25 divides the oscillation output frequency of the voltage-controlled oscillator 24 by a factor of N, and provides the divided oscillated output to the phase comparator 21. This divider-circuit 25 is, as shown in FIG. 2, for example, composed of a 4-bit counter 26 and a 10-bit counter 27, while both of the counters 26 and 27 are constituted of a synchronization counter. Consequently, the divider-circuit 25 has a 14-bit control-input, and by setting this control-input, it is able to set the denominator N of dividing-number 1/N to the range of 2 to 214, in other words setting the range from 2 to 16384.

Figure 3:
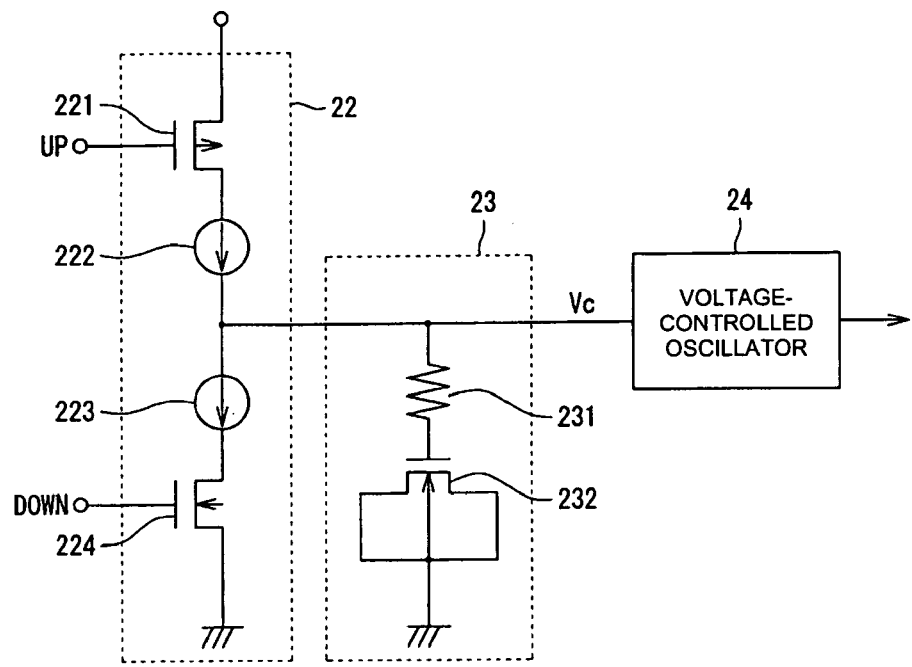
FIG. 3 is a circuit diagram showing the specific composition of the charge pump circuit and the loop filter circuit shown in FIG. 2.

Hereafter, the specific compositions of the charge pump circuit 22 shown in FIG. 2 and the loop filter 23 are described while referring to FIG. 3.

The charge pump circuit 22 is constituted of, as shown in FIG. 3, a PMOS transistor 221 which is used as a switching-element, a constant-current circuit 222 that feeds the current into the loop filter 23, a constant-current circuit 223 that draws out current from the loop filter 23, and an NMOS transistor 224 which is used as a switching element. These are connected in series where one end is fed by a supply voltage VDD while the other end is grounded. Additionally, the unit, commonly connected to the constant-current circuit 222 and to the constant-current circuit 223, is respectively connected to one end of the resistor 231 that composes the loop filter 23, and to the input side of the voltage-controlled oscillator 24.

In the charge pump circuit 22 composed as such, if an 'UP' signal from the phase comparator 21 is in level H, the MOS transistor 221 switches on, causing the constant-current circuit 222 to feed the current into the loop filter 23. In contrast, if an 'UP' signal from the phase comparator 21 is in level H, the MOS transistor 224 switches off, causing the constant-current circuit 223 to draw out the current from the loop filter 23.

The loop filter 23 is constituted of the resistor 231 and the capacitor 232 that is formed (created) with an NMOS transistor, as shown in FIG. 3. These are connected in series. One end is connected to the output side of the charge pump circuit 22, and to the input side of the voltage-controlled oscillator 24 respectively, and the other end is grounded.

The capacitor 232 utilizes the gate capacitance of an NMOS transistor. In other words, the gate of the MOS transistor is connected to one end of the resistor 231. Moreover, the source, drain, and substrate terminal of the MOS transistor are commonly connected, and the commonly connected unit is grounded.

In addition, in the above example, the capacitor 232 is formed with an NMOS transistor, but alternatively, it can also be formed with a PMOS transistor.

The loop filter 23 composed as such, while integrating the output current from the charge pump circuit 22, removes the noise component, and converts that current to the control-voltage, and provides the converted control-voltage Vc to the voltage-controlled oscillator 24.

Hereafter, the determinations of the capacity of the capacitor 231 of the loop filter 23, the resistance of the resistor 231 of the loop filter 23, and the electric current value of the charge pump circuit 22, which are described in FIG. 3, are described.

In the PLL circuit 14 shown in FIG. 2, a natural angular frequency ωn and a damping factor ζ, which relate to its response characteristics, are expressed in the following formulas 1 and 2.

$$\omega n = \sqrt{[(Kv \times 2\pi \times Ic)/(N \times 2\pi \times C)]} \quad \text{Formula 1:}$$

$$\zeta = (R \times C \times \omega n)/2 \quad \text{Formula 2:}$$

Here, in formula 1, Kv is the voltage gain of the voltage-controlled oscillator 24, Ic is the electric current value of the charge pump circuit 22, N is the denominator of dividing-ratio 1/N of the divider-circuit 25, and C is the capacity of the capacitor 232 of the loop filter 23. Moreover, in formula 2, R is the resistance of the resistor 231 of the loop filter 23.

Formula 3 is obtained by solving formula 1 with regards to C, and formula 4 is obtained by solving formula 2 with regards to R.

$$C = (Kv \times Ic)/(N \times \omega n^2) \quad \text{Formula 3:}$$

$$R = 2\zeta/(C \times \omega n) \quad \text{Formula 4:}$$

The following formula 5 is obtained by assigning formula 3 into formula 4.

$$R = (2\zeta \times N \times \omega n)/(Kv \times Ic) \quad \text{Formula 5:}$$

Furthermore, in the PLL circuit 14 shown in FIG. 2, a unit gain G becomes as shown in the following formula 6.

$$G = (2 \times \zeta \times \omega n)/2\pi \quad \text{Formula 6:}$$

Further, the following formula 7 is obtained by simplifying formula 6 using formula 2 and formula 3.

$$G = (R \times Ic \times Kv)/(2\pi n \times N) \quad \text{Formula 7:}$$

The following formula 8 is obtained by solving formula 7 with regards to Ic.

$$Ic = (2\pi n \times N \times G)/(R \times Kv) \quad \text{Formula 8:}$$

Here, in the present embodiment, in the PLL circuit 14, the natural angular frequency ωn is set to the range of 3 KHz to 10 KHz, and the damping factor ζ is set to 0.01 or less. Additionally, the denominator N of dividing-ratio 1/N of the divider-circuit 25 is set within the range of 100 to 20,000 as described above. Furthermore, the voltage gain Kv of the voltage-controlled oscillator 24 can be set to any value.

Under such conditions, the capacity C of the capacitor 232 of the loop filter 23 can be determined using formula 3, and that the capacity C can be reduced. Therefore, the capacity C of the capacitor 231 is set to range from 300 pF to 1,000 pF.

Furthermore, if the capacity C of the capacitor 232 is determined, the resistance of the resistor 231 of the loop filter 23 can be determined using formula 4. Therefore, the capacity C of the capacitor 232 is set to range from 0.1 kΩ to 10 kΩ.

Moreover, if the resistance of the resistor 231 of the loop filter 23 is determined, the electric current value Ic of the charge pump circuit 22 can be determined using formula 8. Therefore, the electric current value Ic of the charge pump circuit 22 is set to range from 0.5 μA to 3 μA.

As described above, in the present embodiment, the base-clock signal S1 generated by the base-clock signal generation circuit 11 is provided to the time-base processing circuit 12 and to the PLL circuit 14 respectively. Consequently, with the present embodiment, the fundamental-frequency-oscillation circuit that has been conventionally required (see FIG. 6) can be omitted, thus significantly reducing excessive current consumption.

Furthermore, in the present embodiment, in the PLL circuit 14, the natural angular frequency ωn is set to the range of 3 KHz to 10 KHz, and the damping factor ζ to 0.01 or less, therefore the response characteristics of PLL circuits can be slowed down. As a result, as to the high-speed clock signal output from the PLL circuit 14, it is possible to significantly improve the jitter characteristics as shown, for example, in FIG. 5, and to prevent the malfunctions upon conducting signal processing with the clock signal S3.

Figure 5:
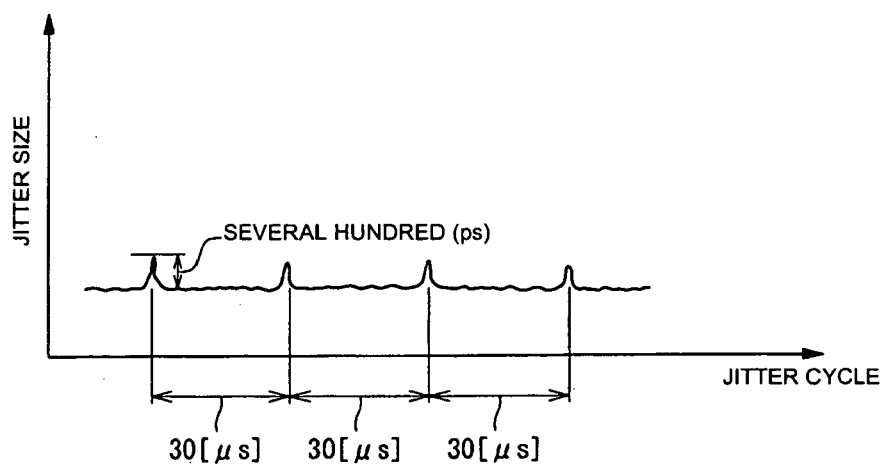
FIG. 5 is a characteristics diagram showing an example of improvement provided by the present invention.

FIG. 5, similar to the case of FIG. 4, shows the case where the frequency of the base-clock signal S1 from the base-clock signal generation circuit 11 is set to 32 KHz, the factor N of that the base-clock signal S1 in the PLL circuit 14 is set to about 15,000, and the frequency of the clock signal S3 is set to 500 MHz. For that clock signal S3, a jitter of several ns will be generated every 30 μs.

However, the jitter will amount to several hundred ps for 1 ns for a half-cycle time of the clock signal S3, and relatively to the case described in FIG. 4, the jitter can be reduced significantly. Consequently, in the present embodiment, the high-speed signal processing circuit 15, which operates with the clock signal S3 as the driving signal, can prevent the malfunctions caused by its jitter.

Moreover, with the present embodiment, the capacitor 232 of the loop filter 23 that composes the PLL circuit 14 is composed with a gate capacitance of a MOS transistor. Consequently, the need for external capacitor is eliminated, while making it possible to bring the costs down by reducing the number of unit items, and to prevent the impairments that are associated with the conventional use of an external capacitor.

Furthermore, with the present embodiment, it is possible to make a PLL circuit in its entirety into an integrated circuit. This makes the operation of a PLL loop tolerant to negative affect from external noise etc, thus improving the reliability of the operation.

Further, the above embodiment is equipped with the reference-clock signal generation circuit 11, as shown in FIG. 1. However, this invention does not necessarily require reference-clock signal generation circuit 11. In such a case, the time-base processing circuit 12 and the PLL circuit 14 receive the input signal that corresponds to the base-clock signal S1 generated by the reference-clock signal generation circuit 11 externally.

The semiconductor integrated device of the present embodiment can be applied as an ASIC (application specific integrated circuit) for application examples including mobile phones, liquid crystal displays, wristwatches etc. Some application examples will now be described.

When applied to mobile phones, the high-speed signal processing circuit 15 shown in FIG. 1 is composed as a logic circuit and camera-driving circuit of mobile phones. The logic circuit and the camera-driving circuit are driven by the clock signal S3 (50 MHz) from the PLL circuit 14. However, if that drive is not required, while the operation of the PLL circuit 14 stops operating, only the logic circuit operates using the reference-clock signal S1 (32 kHz) from the reference-clock signal generation circuit 11.

When applied to liquid crystal displays, the high-speed signal processing circuit 15 shown in FIG. 1 is composed as a display-driving circuit of the liquid crystal displays. The display-driving circuit is driven by the clock signal S3 from the PLL circuit 14. Here, the clock signal S3, generated by the PLL circuit 14, varies according to the display size of the liquid crystal displays. This makes it possible, using the clock signal S3, to implement an easily viewable display in accordance with the display size.

Furthermore, when applied to wristwatches, the high-speed signal processing circuit 15 shown in FIG. 1 is composed as a high-speed data processing circuit that processes various kinds of data at a high speed. The data processing circuit is driven by the clock signal S3 from the PLL circuit 14. Once the processing is complete, the data processing circuit is turned to a low-power mode while the operation of the PLL circuit 14 stops operating.

What is claimed is:

1. A semiconductor integrated device, comprising:
    a reference-clock signal generation circuit that generates a predetermined low-speed reference-clock signal used for a time base;
    a time base processing circuit that receives the reference-clock signal;
    a high-speed signal processing circuit that conducts high-speed signal processing; and
    a phase-locked loop circuit that generates a high-speed clock signal by multiplying a frequency of the reference-clock signal generated by the reference-clock signal generation circuit by a factor of N, and provides the high-speed signal processing circuit with the generated high-speed clock signal as a driving signal of the high-speed signal processing circuit;
    wherein a range of the reference-clock signal generated by the reference-clock signal generation circuit is from 10 KHz to 100 KHz inclusive, the factor N is at least 100, and the high-speed processing circuit communicates with the time base processing circuit and the phase-locked loon circuit.

2. A semiconductor integrated device, comprising:
    a time base processing circuit that receives a reference-clock signal;
    a high-speed signal processing circuit that conducts high-speed signal processing; and
    a phase-locked loop circuit that inputs a predetermined low-speed reference-clock signal used for a time base from an outside source, generates a high-speed clock signal by multiplying a frequency of the input reference-clock signal by a factor of N, and provides the high-speed signal processing circuit with the generated high-speed clock signal as a driving signal of the high-speed signal processing circuit;
    wherein a range of the reference-clock signal input from the outside source is from 10 KHz to 100 KHz inclusive, and the factor N is at least 100, and the high-speed processing circuit communicates with the time base processing circuit and the phase-locked loop circuit.

3. The semiconductor integrated device according to claim 1, wherein the phase-locked loop circuit includes:
    an oscillator that generates an oscillation frequency in accordance with a voltage-controlled voltage that is input;
    a divider-circuit that divides the oscillation frequency of the oscillator by N;
    a phase comparator that makes a phase comparison between a reference-clock signal generated by the reference-clock signal generation circuit and an output signal of the divider-circuit;
    a charge pump circuit that generates a signal in response to the phase comparison of the phase comparator; and
    a loop filter that makes only a low frequency component out of an output signal of the charge pump circuit pass through as an output signal, and provides the oscillator with the output signal as the voltage-controlled voltage; and
    wherein each element of the phase-locked loop circuit is made into an integrated circuit, and the value N for dividing the frequency by the divider-circuit is at least 100.

4. The semiconductor integrated device according to claim 1, wherein a range of a natural angular frequency $\omega n$ that relates to a response of a system of the phase-locked loop circuit is from 3 kHz to 10 kHz inclusive, and a damping factor $\zeta$ that relates to the response is 0.01 or less.

5. The semiconductor integrated device according to claim 4, wherein the loop filter includes a low-pass filter having a capacitor and a resistor in combination, and wherein a capacity range of the capacitor is from 300 pF to 1000 pF inclusive, and a resistance range of the resistor is from 0.1 k$\Omega$ to 10 k$\Omega$ inclusive.

6. The semiconductor integrated device according to claim 5, wherein an electric current value range of the charge pump circuit is from 0.5 $\mu$A to 3 $\mu$A inclusive.

7. The semiconductor integrated device according to claim 5, wherein the capacitor of the loop filter is created with a gate capacitance of a metal-oxide semiconductor transistor.

8. The semiconductor integrated device according to claim 2, wherein the phase-locked loop circuit includes:

an oscillator that generates an oscillation frequency in accordance with a voltage-controlled voltage that is input;

a divider-circuit that divides the oscillation frequency of the oscillator by N;

a phase comparator that makes a phase comparison between the reference-clock signal generated by a reference-clock signal generation circuit and an output signal of the divider-circuit;

a charge pump circuit that generates a signal in response to the phase comparison of the phase comparator; and a loop filter that makes only a low frequency component out of an output signal of the charge pump circuit pass through as an output signal, and provides the oscillator with the output signal as the voltage-controlled voltage; and wherein each element of the phase-locked loop circuit is made into an integrated circuit, and the value N for dividing the frequency by the divider-circuit is at least 100.

9. The semiconductor integrated device according to claim 2, wherein a range of a natural angular frequency $\omega n$ that relates to a response of a system of the phase-locked loop circuit is from 3 kHz to 10 kHz inclusive, and a damping factor $\zeta$ that relates to the response is 0.01 or less.

10. The semiconductor integrated device according to claim 8, wherein the loop filter includes a low-pass filter having a capacitor and a resistor in combination, and wherein a capacity range of the capacitor is from 300 pF to 1000 pF inclusive, and a resistance range of the resistor is from 0.1 kΩ to 10 kΩ inclusive.

11. The semiconductor integrated device according to claim 10, wherein an electric current value range of the charge pump circuit is from 0.5 µA to 3 µA inclusive.

12. The semiconductor integrated device according to claim 10, wherein the capacitor of the loop filter is created with a gate capacitance of a metal-oxide semiconductor transistor.

* * * * *

UNITED STATES PATENT AND TRADEMARK OFFICE
CERTIFICATE OF CORRECTION

PATENT NO. : 7,126,392 B2  Page 1 of 1
APPLICATION NO. : 10/999365
DATED : October 24, 2006
INVENTOR(S) : Yasunari Furuya It is certified that error appears in the above-identified patent and that said Letters Patent is hereby corrected as shown below:

Col. 2, Line 1      "con" should be --ωn--

Col. 2, Line 5      "an" should be --ωn--

Col. 8, Line 7      "(2nn x N)" should be -- (2n x N) --

Col. 8, Line 11      "(2nn x N x G)" should be -- (2n x N x G) --

Col. 10, Line 6 (Claim 1)      "loon" should be --loop--

Signed and Sealed this

Tenth Day of April, 2007

JON W. DUDAS
*Director of the United States Patent and Trademark Office*